United States Patent
Kikuchi et al.

(10) Patent No.: US 11,948,642 B2
(45) Date of Patent: *Apr. 2, 2024

(54) SEMICONDUCTOR FLASH MEMORY DEVICE WITH VOLTAGE CONTROL ON COMPLETION OF A PROGRAM OPERATION AND SUBSEQUENT TO COMPLETION OF THE PROGRAM OPERATION

(71) Applicant: Kioxia Corporation, Tokyo (JP)

(72) Inventors: Kenrou Kikuchi, Yokohama (JP); Yasuhiro Shimura, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/106,520

(22) Filed: Feb. 7, 2023

(65) Prior Publication Data
US 2023/0186991 A1      Jun. 15, 2023

Related U.S. Application Data

(63) Continuation of application No. 17/004,272, filed on Aug. 27, 2020, now Pat. No. 11,600,327.

(30) Foreign Application Priority Data

Sep. 6, 2019 (JP) .................................. 2019-163385

(51) Int. Cl.
*G11C 16/04* (2006.01)
*G11C 11/56* (2006.01)
(Continued)

(52) U.S. Cl.
CPC ...... *G11C 16/0483* (2013.01); *G11C 11/5628* (2013.01); *G11C 11/5642* (2013.01);
(Continued)

(58) Field of Classification Search
CPC ......... G11C 16/30; G11C 16/26; G11C 16/24; G11C 16/10; G11C 16/08; G11C 11/5642; G11C 11/5628
(Continued)

(56) References Cited

U.S. PATENT DOCUMENTS 6,301,158 B1   10/2001  Iwahashi
7,466,562 B2   12/2008  Ogawa et al.
(Continued)

FOREIGN PATENT DOCUMENTS

JP   4271168 B2   8/2009
JP   6199838 B2   9/2017
(Continued)

*Primary Examiner* — Sung Il Cho
(74) *Attorney, Agent, or Firm* — Oblon, McClelland, Maier & Neustadt, L.L.P.

(57) ABSTRACT

A semiconductor memory device includes: a memory cell array including a plurality of NAND strings, each of the plurality of NAND strings including a plurality of memory cell transistors connected to each other in series; a plurality of word lines commonly connected to the plurality of memory strings and connected to the plurality of memory cell transistors, respectively; and a row decoder configured to supply a predetermined voltage higher than a ground voltage to each of the plurality of word lines after a program operation for writing data to a selected word line is completed.

9 Claims, 10 Drawing Sheets

(51) Int. Cl.
*G11C 16/08* (2006.01)
*G11C 16/10* (2006.01)
*G11C 16/24* (2006.01)
*G11C 16/26* (2006.01)
*G11C 16/30* (2006.01)

(52) U.S. Cl.
CPC .............. *G11C 16/08* (2013.01); *G11C 16/10* (2013.01); *G11C 16/24* (2013.01); *G11C 16/26* (2013.01); *G11C 16/30* (2013.01)

(58) Field of Classification Search
USPC .................................................. 365/185.17
See application file for complete search history.

(56) References Cited

U.S. PATENT DOCUMENTS

| | | | |
|---|---|---|---|
| 7,701,777 B2 | 4/2010 | Ogawa et al. | |
| 8,004,903 B2 | 8/2011 | Ogawa et al. | |
| 9,418,732 B2 | 8/2016 | Maejima | |
| 9,704,570 B2 | 7/2017 | Abe et al. | |
| 9,792,996 B1 | 10/2017 | Date | |
| 9,865,351 B2 * | 1/2018 | Maejima | G11C 16/06 |
| 9,911,499 B2 | 3/2018 | Abe et al. | |
| 10,008,271 B1 * | 6/2018 | Diep | G11C 16/26 |
| 10,083,755 B2 | 9/2018 | Haibl et al. | |
| 10,255,979 B1 | 4/2019 | Shimura et al. | |
| 2014/0126285 A1 | 5/2014 | Kang | |
| 2017/0178736 A1 * | 6/2017 | Yang | G11C 11/5628 |
| 2017/0249994 A1 * | 8/2017 | Hashimoto | G11C 16/0483 |
| 2018/0012667 A1 * | 1/2018 | Costa | G11C 16/0483 |
| 2019/0147959 A1 * | 5/2019 | Hsu | G11C 8/12 365/185.12 |
| 2019/0244673 A1 * | 8/2019 | Yang | G11C 16/14 |
| 2019/0392909 A1 * | 12/2019 | Yang | G11C 16/32 |
| 2020/0243145 A1 | 7/2020 | Yamada | |
| 2020/0402587 A1 * | 12/2020 | Chibvongodze | G11C 16/0483 |

FOREIGN PATENT DOCUMENTS

| | | |
|---|---|---|
| JP | 2017-216025 A | 12/2017 |
| JP | 2018-121243 A | 8/2018 |
| JP | 2019-67342 A | 4/2019 |
| WO | WO 2015/037159 A1 | 3/2015 |

* cited by examiner

SEMICONDUCTOR FLASH MEMORY DEVICE WITH VOLTAGE CONTROL ON COMPLETION OF A PROGRAM OPERATION AND SUBSEQUENT TO COMPLETION OF THE PROGRAM OPERATION

CROSS-REFERENCE TO RELATED APPLICATIONS

This application is a continuation application of U.S. application Ser. No. 17/004,272, filed Aug. 27, 2020, now U.S. Pat. No. 11,600,327, which is based upon and claims the benefit of priority from the prior Japanese Patent Application No. 2019-163385 filed in Japan on Sep. 6, 2019; the entire contents of which are incorporated herein by reference.

FIELD

Embodiments described herein relate generally to a semiconductor memory device.

BACKGROUND

A NAND-type flash memory is known as a type of semiconductor memory devices. The semiconductor memory device is required to write data at high speed.

DETAILED DESCRIPTION

Embodiments provide a semiconductor memory device including: a memory cell array including a plurality of memory strings, each of the plurality of memory strings including a plurality of memory cell transistors connected to each other in series; a plurality of word lines commonly connected to the plurality of memory strings and connected to the plurality of memory cell transistors, respectively; and a row decoder configured to supply a predetermined voltage higher than a ground voltage to each of the plurality of word lines after a program operation for writing data to a selected word line is completed.

Embodiments will be described below with reference to the drawings.

First Embodiment (Configuration)
[1] Configuration of Memory System

Figure 1:
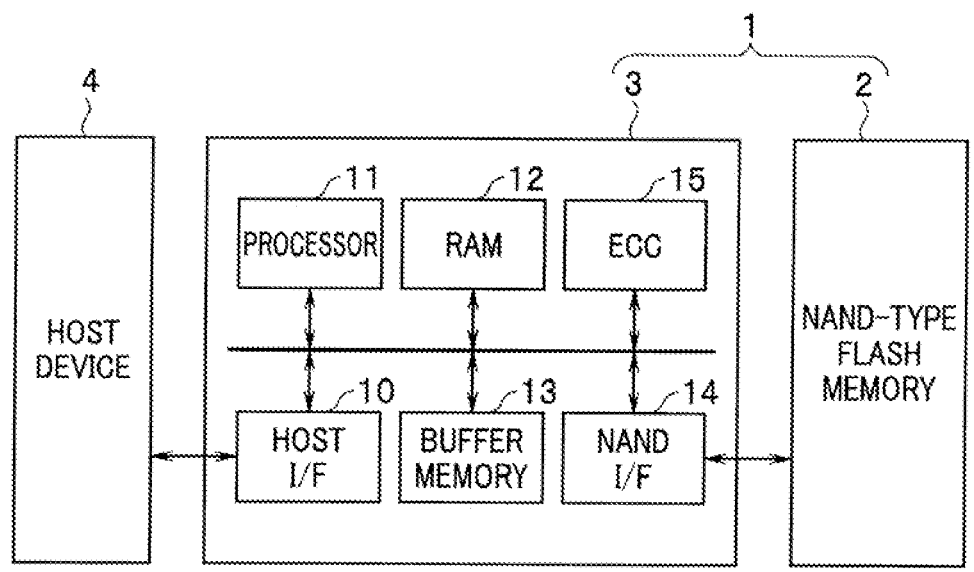
FIG. 1 is a block diagram of a memory system according to a first embodiment.

FIG. 1 is a block diagram illustrating a memory system 1 according to a first embodiment. The memory system 1 includes a NAND-type flash memory (semiconductor memory device) 2 and a memory controller 3.

The memory system 1 may be configured by a plurality of chips, which constitute the memory system 1, on a motherboard on which a host device 4 is mounted; alternatively, the memory system 1 may be configured as a system LSI (large-scale integrated circuit) or an SoC (system-on-a-chip) that is implemented by one module. Examples of the memory system 1 include a memory card such as an SD card, an SSD (solid-state-drive), and an eMMC (embedded-multi-media-card).

The NAND-type flash memory 2 includes a plurality of memory cells and stores data in a non-volatile manner. A specific configuration of the NAND-type flash memory 2 will be described below.

In response to an instruction from the host device 4, the memory controller 3 instructs the NAND-type flash memory 2 to perform a write operation (also referred to as a program operation), a read operation, and an erase operation. The memory controller 3 manages a memory space of the NAND-type flash memory 2. The memory controller 3 includes a host interface circuit (host I/F) 10, a processor 11, a RAM (random access memory) 12, a buffer memory 13, a NAND interface circuit (NAND I/F) 14, and an ECC (error checking and correcting) circuit 15.

The host interface circuit 10 is connected to the host device 4 through a host bus and performs interface processing with the host device 4. The host interface circuit 10 transmits and receives instructions, addresses, and data to/from the host device 4.

The processor 11 is configured by a CPU (central processing unit), for example. The processor 11 controls an overall operation of the memory controller 3. For example, when a write instruction is received from the host device 4, the processor 11 issues a write instruction to the NAND-type flash memory 2 through the NAND interface circuit 14 in response to the write instruction. Similar operations are also performed in read and erase operations. The processor 11 executes various processes such as wear leveling to manage the NAND-type flash memory 2.

The RAM 12 is used as a work space of the processor 11 and stores firmware data loaded from the NAND-type flash memory 2 and various tables generated by the processor 11. The RAM 12 is configured as, for example, a DRAM or an SRAM.

The buffer memory 13 temporarily retains data transmitted from the host device 4 and temporarily retains data transmitted from the NAND-type flash memory 2.

The NAND interface circuit 14 is connected to the NAND-type flash memory 2 through a NAND bus and performs interface processing with the NAND-type flash memory 2. The NAND interface circuit 14 transmits and receives instructions, addresses, and data to/from the NAND-type flash memory 2.

During the data write operation, the ECC circuit 15 generates an error correcting code for write data, adds the error correcting code to the write data, and transmits the resultant write data to the NAND interface circuit 14. During the data read operation, the ECC circuit 15 performs error detection and/or error correction for read data, using the error correcting code included in the read data. The ECC circuit 15 may be provided in the NAND interface circuit 14.

[2] Configuration of NAND-Type Flash Memory

Figure 2:
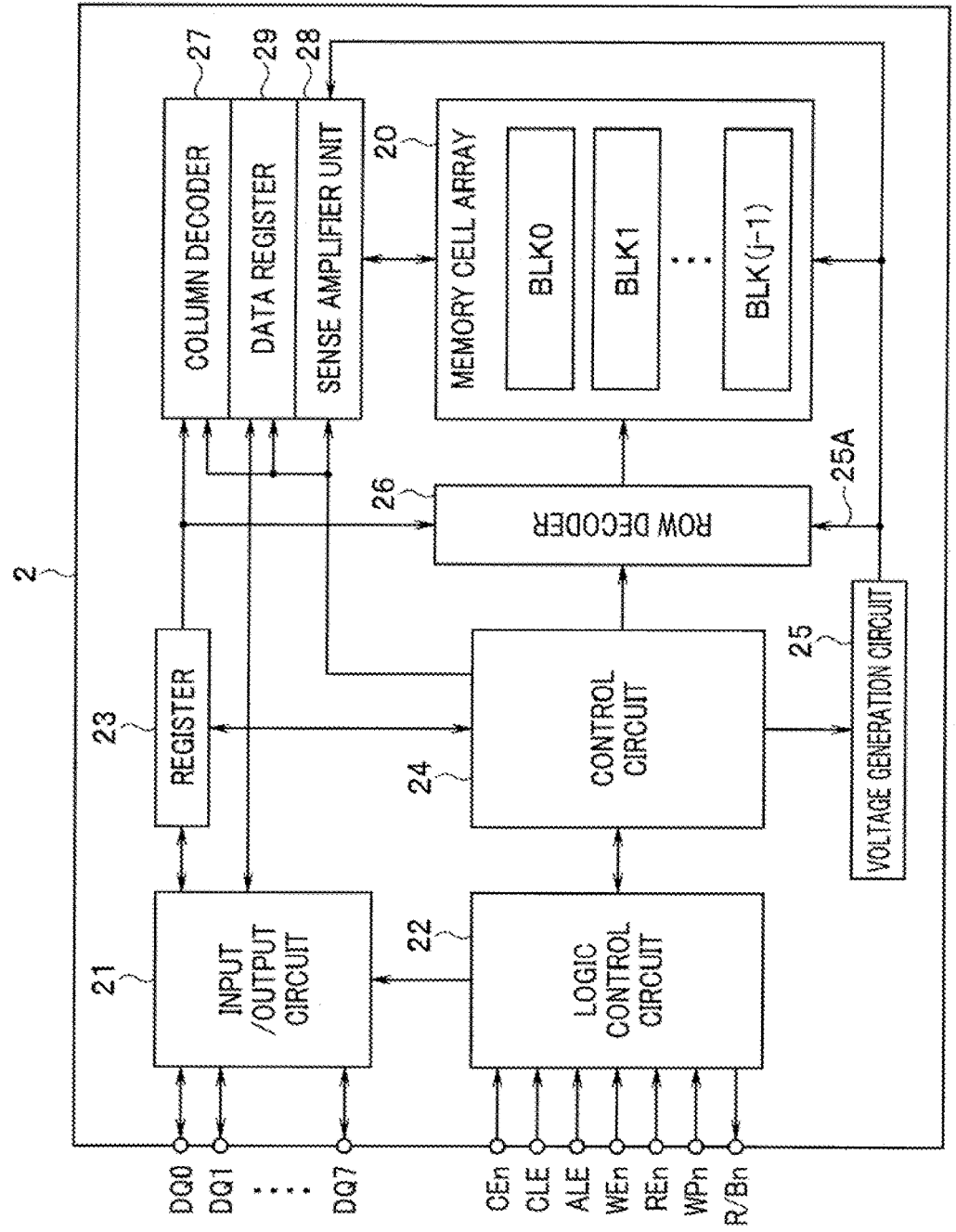
FIG. 2 is a block diagram of a NAND-type flash memory according to the first embodiment.

FIG. 2 is a block diagram of the NAND-type flash memory 2 illustrated in FIG. 1. The NAND-type flash memory 2 includes a memory cell array 20, an input/output circuit 21, a logic control circuit 22, a register 23, a control circuit 24, a voltage generation circuit 25, a row decoder 26, a column decoder 27, a sense amplifier unit 28, and a data register (data cache) 29.

The memory cell array 20 includes j blocks BLK0 to BLK(j−1). The j is an integer of 1 or more. Each of the plurality of blocks BLK includes a plurality of memory cell transistors. The memory cell transistors constitute electrically rewritable memory cells. A plurality of bit lines BL, a plurality of word lines WL, and a source line SL are arranged in the memory cell array 20 so as to control voltages applied to the respective memory cell transistors. A specific configuration of the blocks BLK will be described below.

The input/output circuit 21 and the logic control circuit 22 are connected to the memory controller 3 through a NAND bus. The input/output circuit 21 transmits and receives signals DQ (for example, DQ0 to DQ7) to/from the memory controller 3 through the NAND bus.

The logic control circuit 22 receives external control signals (for example, a chip enable signal CEn, a command latch enable signal CLE, an address latch enable signal ALE, a write enable signal WEn, a read enable signal REn, and a write protect signal WPn) from the memory controller 3 through the NAND bus. The "n" added to the name of each signal indicates active low. The logic control circuit 22 transmits a ready/busy signal R/Bn to the memory controller 3 through the NAND bus.

The signal CEn enables selection of the NAND-type flash memory 2. The signal CLE enables a command transmitted as the signal DQ to be latched in the command register. The signal ALE enables an address transmitted as the signal DQ to be latched in the address register. The signal WEn enables writing. The signal REn enables reading. The signal WPn inhibits writing and erasing. The signal R/Bn indicates whether the NAND-type flash memory 2 is in a ready state (a state in which an external instruction can be accepted) or a busy state (a state in which an external instruction cannot be accepted). The memory controller 3 can be informed of the state of the NAND-type flash memory 2 by accepting the signal R/Bn.

The register 23 includes a command register, an address register, and a status register. The command register temporarily retains a command. The address register temporarily retains an address. The status register temporarily retains data required for the operation of the NAND-type flash memory 2. The register 23 is configured by, for example, an SRAM.

The control circuit 24 receives a command from the register 23 and comprehensively controls the NAND-type flash memory 2 according to a sequence based on such a command.

The voltage generation circuit 25 receives a power supply voltage from the outside of the NAND-type flash memory 2 and generates a plurality of voltages necessary for a write operation, a read operation, and an erase operation, using the power supply voltage. The voltage generation circuit 25 supplies the generated voltages to the memory cell array 20, the row decoder 26, and the sense amplifier unit 28. etc. For example, the voltage generation circuit 25 supplies a voltage to the row decoder 26 through a CG line 25A.

The row decoder 26 receives a row address from the register 23 and decodes such a row address. The row decoder 26 selects word lines, based on the decoded row address. The row decoder 26 transfers the voltages required for the write operation, the read operation, and the erase operation to the selected block. In particular, as will be described below, the row decoder 26 can adjust voltages applied to respective word lines WL and a select transistor ST to be described below.

The column decoder 27 receives a column address from the register 23 and decodes such a column address. The column decoder 27 supplies a predetermined voltage to respective bit lines BL based on the decoded column address.

During the data read operation, the sense amplifier unit 28 senses and amplifies data that is read from a memory cell transistor to a bit line. During the data write operation, the sense amplifier unit 28 supplies write data to the bit lines BL.

During the data read operation, the data register 29 temporarily retains the data transferred from the sense amplifier unit 28, and serially transfers the data to the input/output circuit 21. During the data write operation, the data register 29 temporarily retains the data serially transferred from the input/output circuit 21, and transfers the data to the sense amplifier unit 28. The data register 29 is configured by an SRAM, for example.

[3] Configuration of Block BLK

Figure 3:
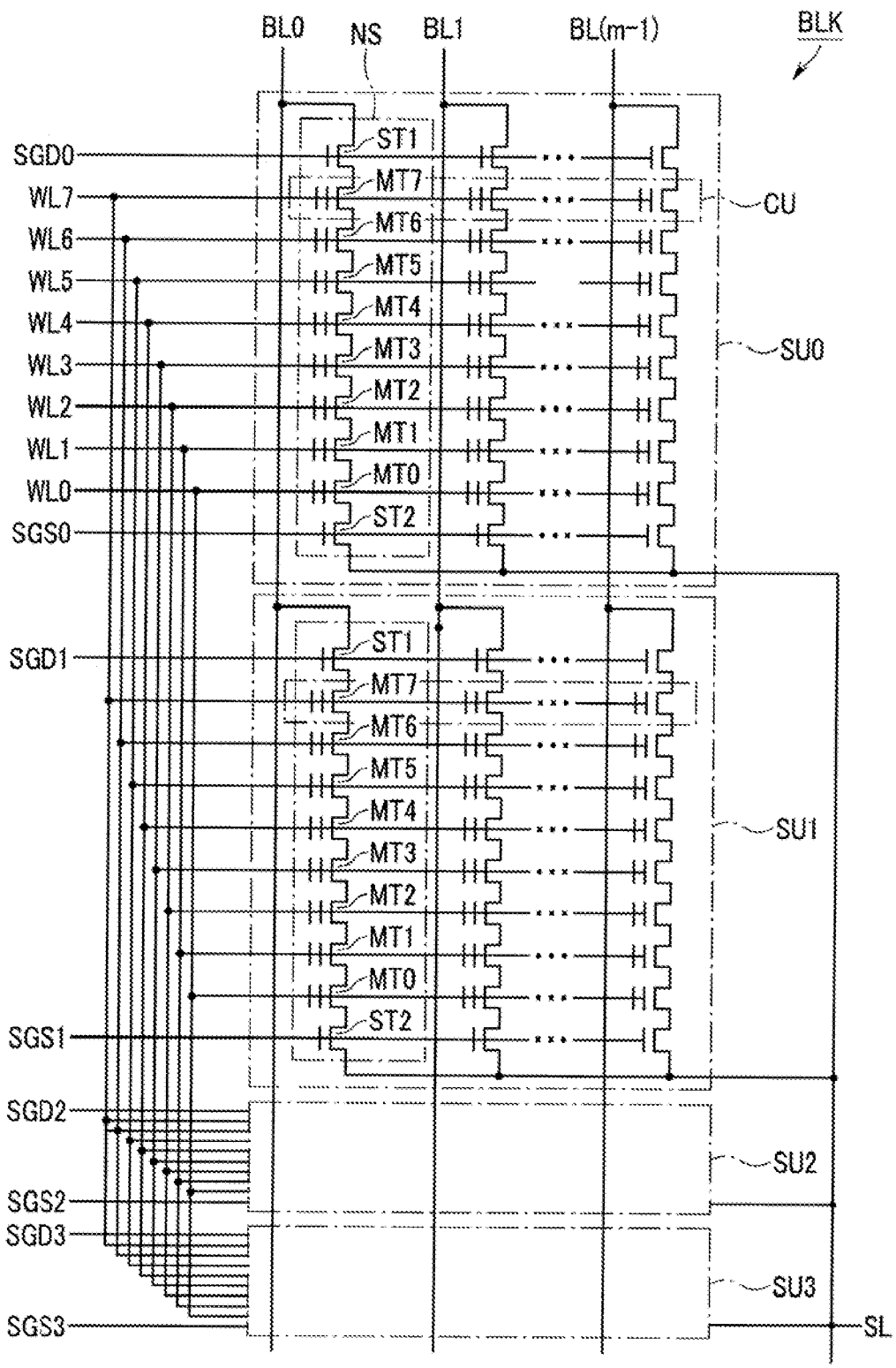
FIG. 3 is a circuit diagram of one block included in a memory cell array according to the first embodiment.

FIG. 3 is a circuit diagram of one block BLK included in the memory cell array 20. Each of the blocks BLK includes a plurality of string units SU. In FIG. 3, four string units SU0 to SU3 are illustrated.

Each of the string units SU includes a plurality of NAND strings (memory strings) NS.

Each of the NAND strings NS includes a plurality of memory cell transistors MT and two select transistors ST1 and ST2. The plurality of memory cell transistors MT are connected in series between a source of the select transistor ST1 and a drain of the select transistor ST2. In the description, the memory cell transistors MT may be referred to as memory cells or cells. FIG. 3 illustrates a configuration example in which the NAND string NS includes eight memory cell transistors MT (MT0 to MT7), but the number of memory cell transistors MT provided in the NAND string NS may be, for example, 32, 64, or 96. The memory cell transistor MT includes a control gate electrode (hereinafter, simply referred to as a control gate) and a charge storage layer, and stores data in a non-volatile manner. Each of the memory cell transistors MT can store a plurality of levels (here, eight levels) of data. As described above, the memory cell array 20 includes the plurality of NAND strings NS, and each of the plurality of NAND strings includes the plurality of memory cell transistors MT connected in series.

Gates of the plurality of select transistors ST1 included in the string unit SU0 are commonly connected to a select gate line SGD0, and similarly, select gate lines SGD1 to SGD3 are connected to the string units SU1 to SU3, respectively. Gates of the plurality of select transistors ST2 included in the string unit SU0 are commonly connected to a select gate line SGS0, and similarly, gates of the plurality of select transistors ST2 of the string units SU1 to SU3 are commonly connected to select gate lines SGS1 to SGS3, respectively. The gates of the plurality of select transistors ST2 in each of the blocks BLK may be connected to a common select gate line SGS. The CG line 25A is connected to word lines WL0 to WL7 of the memory cell transistors MT0 to MT7 in each of the blocks BLK through the row decoder 26. The plurality of word lines WL are commonly connected to the plurality of memory strings NS and are connected to a plurality of control gates of the plurality of memory cell transistors MT, respectively.

The plurality of bit lines BL are connected to the plurality of NAND strings NS, respectively. Among the NAND strings NS arranged in a matrix shape in each of the blocks BLK, drains of the select transistors ST1 of the plurality of NAND strings NS, which are in the same column, are connected in common to one of the bit lines BL0 to BL(m−1). Here, m is an integer of 1 or more.

Each of the bit lines BL commonly connects one NAND string NS included in each of the string units SU between the plurality of blocks BLK. Sources of the plurality of select transistors ST2 included in each of the blocks BLK is commonly connected to a source line SL. The source line SL commonly connects the plurality of NAND strings NS between the plurality of blocks, for example.

The data in the memory cell transistors MT in each of the blocks BLK can be erased in a collective manner, for example. The data read operation and the data write operation are collectively performed for the memory cell transistors MT commonly connected to one word line WL arranged in one string unit SU. A set of the memory cell transistors MT that share the word line WL in the one string unit SU is referred to as a cell unit CU. The write operation and the read operation for the cell unit CU are executed in units of pages. For example, when each cell is a TLC (triple level cell) capable of retaining 3-bit (8-level) data, one cell unit CU can retain data corresponding to three pages. The 3 bits, which can be retained by each of the memory cell transistors MT, correspond to the three pages.

[4] Stacked Structure of Block BLK

Figure 4:
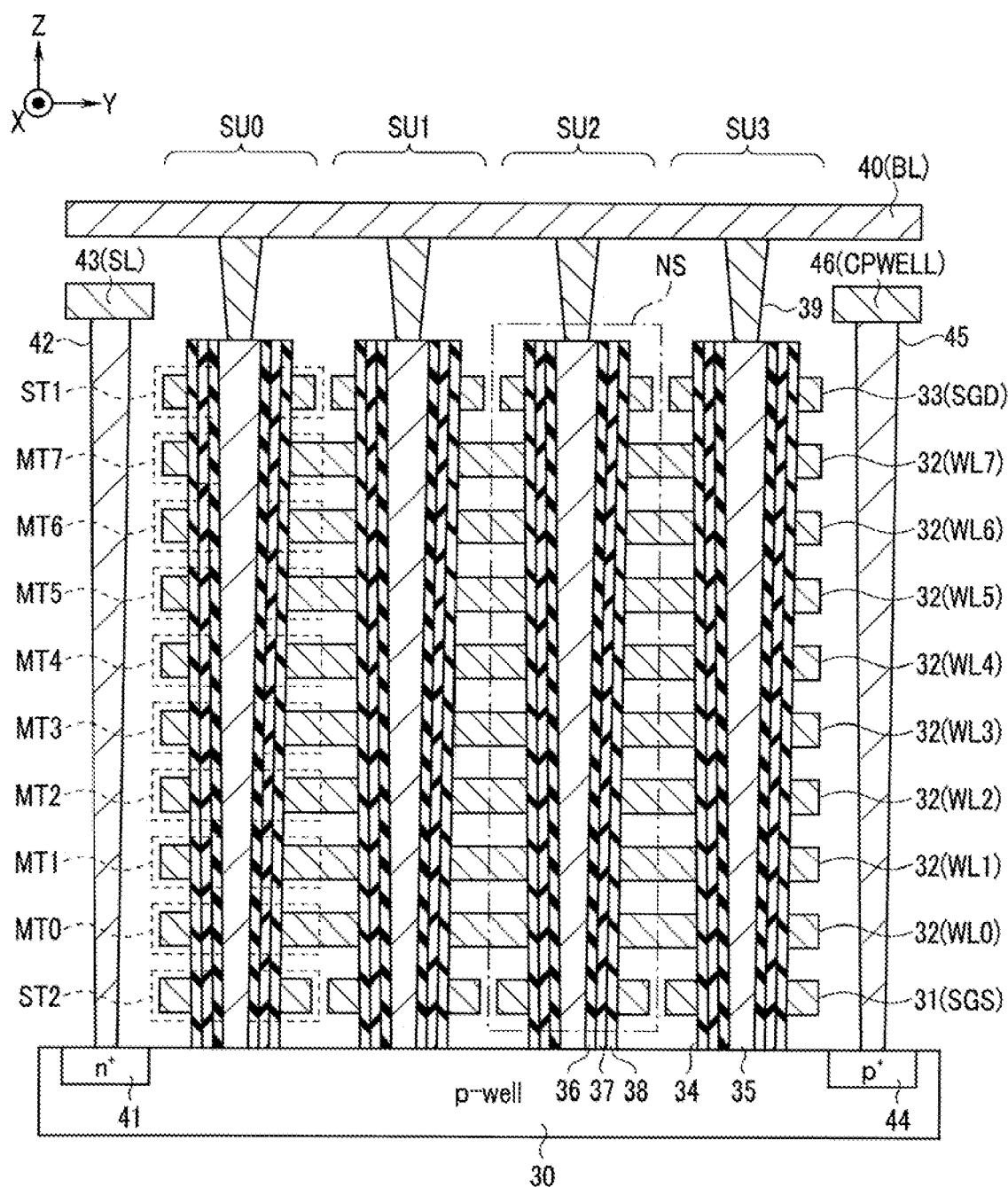
FIG. 4 is a sectional view of a partial region of a block according to the first embodiment.

FIG. 4 is a sectional view of a partial region of the block BLK. An X direction is a direction in which the select gate lines extend, a Y direction intersecting the X direction in a horizontal plane is a direction in which the bit lines extend, and a Z direction is a stacking direction.

The plurality of NAND strings NS are provided on a p-type well region (p-well) 30. In other words, a wiring layer 31 functioning as the select gate line SGS, eight wiring layers 32 functioning as the word lines WL0 to WL7, and a wiring layer 33 functioning as the select gate line SGD are sequentially stacked on the well region 30. An insulating layer (not illustrated) is provided between the stacked wiring layers.

A memory hole 34 penetrates the wiring layers 31, 32, and 33 and reaches the well region 30. A pillar-shaped semiconductor layer (semiconductor pillar) 35 is provided inside the memory hole 34. A gate insulating film 36, a charge storage layer (an insulating film) 37, and a block insulating film 38 are stacked on the side surface of the semiconductor layer 35 in this order. The memory cell transistors MT and the select transistors ST1 and ST2 are configured by these components. The semiconductor layer 35 functions as a current path of the NAND string NS and is a region in which channels of the transistors are formed. An upper end of the semiconductor layer 35 is connected via a contact plug 39 to a metal wiring layer 40 functioning as the bit line BL.

Therefore, each of the NAND strings NS has a channel region CH provided between the select transistors ST1 and ST2. The channel region CH is a channel region of two or more memory cell transistors MT included in each of the memory strings NS, the channel region functioning as a current path of each of the memory strings NS. Then, each of the channel regions CH is connected to one of the plurality of bit lines BL through the select transistor ST1 and is connected to the well region 30 acting as a substrate through the select transistor ST2. Each of the channel regions CH is provided above the substrate and has a pillar shape.

An n+-type diffusion region 41 doped with n-type impurities at high concentration is provided in a surface region of the well region 30. A contact plug 42 is provided on the diffusion region 41, and the contact plug 42 is connected to a metal wiring layer 43 functioning as the source line SL. In addition, a p+-type diffusion region 44 doped with p-type impurities at high concentration is provided in the surface region of the well region 30. A contact plug 45 is provided on the diffusion region 44, and the contact plug 45 is connected to a metal wiring layer 46 functioning as a well wiring CPWELL. The well wiring CPWELL is a wiring used to apply a voltage to the semiconductor layer 35 through the well region 30.

The components described above are arranged in a depth direction of the drawing sheet of FIG. 4 (the X direction), and the string unit SU is configured by a set of the plurality of NAND strings NS arranged in the depth direction.

[5] Threshold Distribution of Memory Cell Transistor

Figure 5:
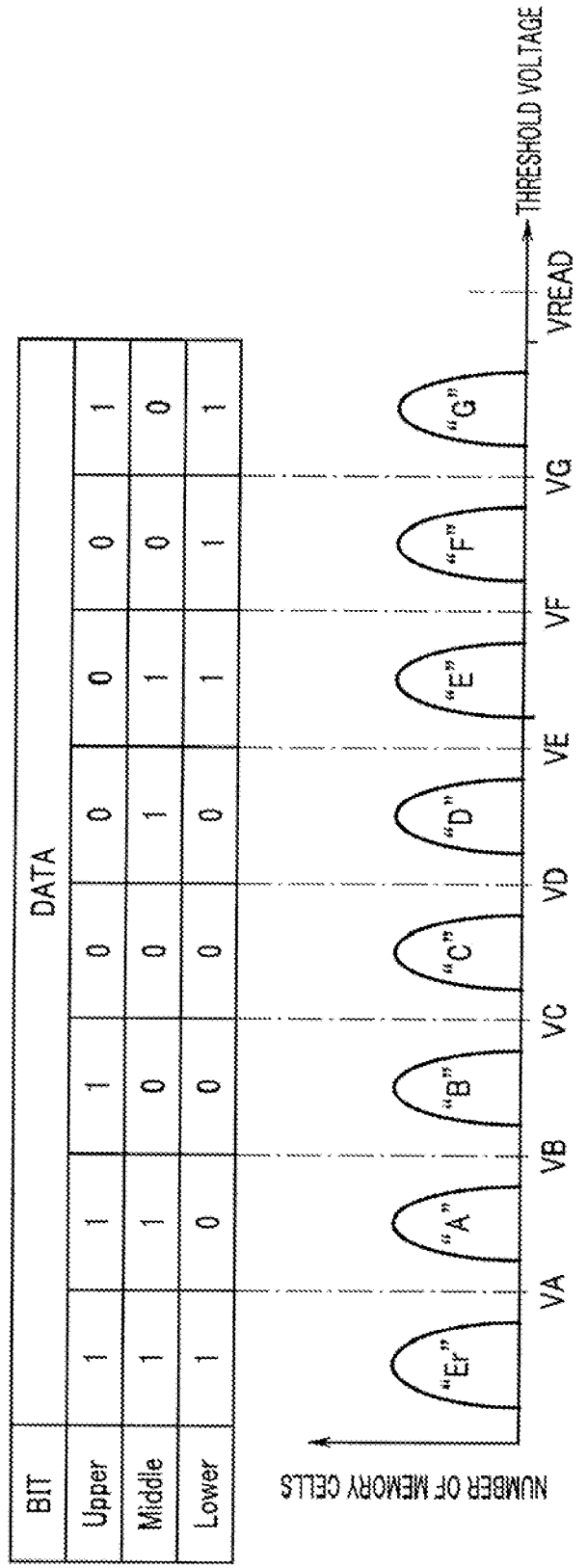
FIG. 5 is a schematic diagram illustrating an example of distribution of threshold voltages of a memory cell transistor according to the first embodiment.

Next, a description will be given below with respect to distributions of a threshold voltage taken by the memory cell transistor MT. FIG. 5 is a schematic diagram illustrating an example of distribution of the threshold voltages of the memory cell transistor MT. The memory cell transistor MT can store data of 2-bit or more. In the present embodiment, when the memory cell transistor MT stores 3-bit data will be made to the case where the memory cell transistor MT stores 3-bit data, a so-called TLC (triple level cell) system will be described as an example.

The 3-bit data is defined by an upper bit, a middle bit, and a lower bit. When the memory cell transistor MT stores 3 bits, the memory cell transistor MT can have one of eight threshold voltages. The eight threshold voltages are referred to as Er, A, B, C, D, E, F, and G levels in order from the lowest state. The thresholds of the plurality of memory cell transistors MT belonging to the respective Er, A, B, C, D, E, F, and G levels form a plurality of distributions.

For example, data of 111, data of 110, data of 100, data of 000, data of 010, data of 011, data of 001, and data of 101 can be allocated to the threshold distributions of the Er, A, B, C, D, E, F, and G levels, respectively. The allocation of the threshold distribution and the data can be set optionally.

In order to determine the data stored in the memory cell transistor MT to be read, the level to which the threshold voltage of such a memory cell transistor MT belongs is determined. Read voltages VA, VB, VC, VD, VE, VF, and VG are used to determine the level.

The Er level corresponds to, for example, a state in which data is erased. The threshold voltage of the memory cell transistor MT belonging to the Er level is smaller than the voltage VA and has a negative value, for example.

The A level to G level correspond to a state in which charges are injected into the charge storage layer and data is written in the memory cell transistor MT. The threshold voltages of the memory cell transistors MT included in the respective distributions have positive values, for example.

The threshold voltage belonging to the A level is higher than the read voltage VA and equal to or lower than the read voltage VB. The threshold voltage belonging to the B level is higher than the read voltage VB and equal to or lower than the read voltage VC. The threshold voltage belonging to the C level is higher than the read voltage VC and equal to or lower than the read voltage VD. The threshold voltage belonging to the D level is higher than the read voltage VD and equal to or lower than the read voltage VE. The threshold voltage belonging to the E level is higher than the read voltage VE and equal to or lower than the read voltage VF. The threshold voltage belonging to the F level is higher than the read voltage VF and equal to or lower than the read voltage VG. The threshold voltage belonging to the G level is higher than the read voltage VG and equal to or lower than a voltage VREAD. The voltage VREAD is a voltage applied to the word line WL connected to the memory cell transistor MT of the cell unit CU which is not to be read, and is higher than the threshold voltage of the memory cell transistor MT belonging to any level. In other words, the memory cell transistor MT, of which CG line 25A is applied with the voltage VREAD, enters ON state regardless of the retained data.

As described above, each of the memory cell transistors MT has the threshold voltage belonging to any of the eight threshold voltage distributions and thus can take eight types of states. The data write operation and the data read operation are performed in units of pages within one cell unit CU. Where the memory cell transistor MT stores 3-bit data, a lower bit, a middle bit, and an upper bit are allocated to the three pages in one cell unit CU. In the following description, the pages to be written or read collectively for the lower bit, the middle bit, and the upper bit are referred to as a lower page, a middle page, and an upper page, respectively.

[6] Configuration of Sense Amplifier Unit and Data Register

Figure 6:
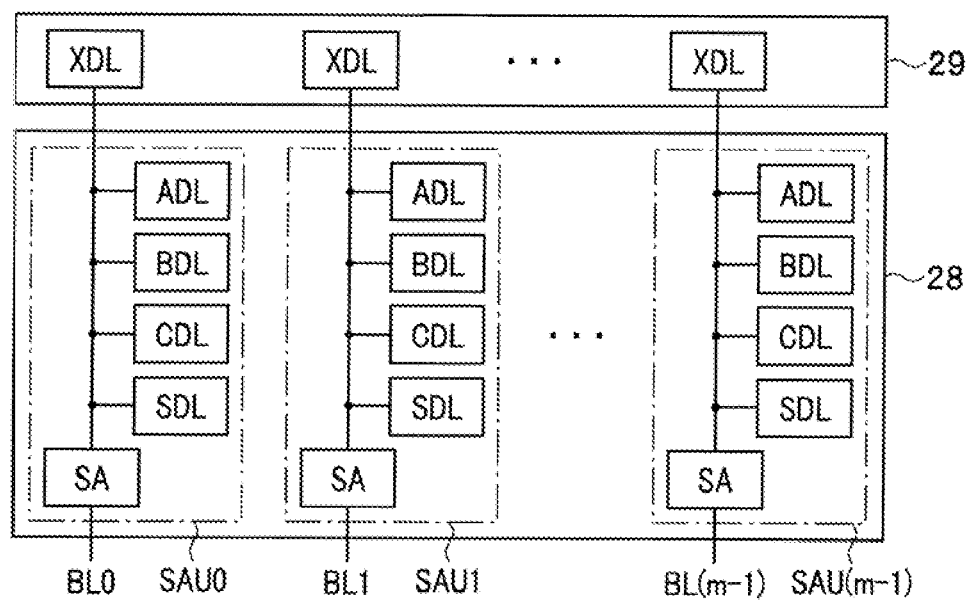
FIG. 6 is a block diagram of a sense amplifier unit and a data register according to the first embodiment.

FIG. 6 is a block diagram of the sense amplifier unit 28 and the data register 29 illustrated in FIG. 2.

The sense amplifier unit 28 includes sense amplifier units SAU0 to SAU(m−1) corresponding to the bit lines BL0 to BL(m−1), respectively. Each of the sense amplifier units SAU includes a sense amplifier SA and data latch circuits SDL, ADL, BDL, and CDL. The sense amplifier SA and the data latch circuits SDL, ADL, BDL, and CDL are connected to each other such that data can be transferred to/from each other.

The data latch circuits SDL, ADL, BDL, and CDL temporarily retain data. During the write operation, the sense amplifier SA controls the voltage of the bit line BL according to the data retained by the data latch circuit SDL. The data latch circuits ADL, BDL, and CDL are used for multi-level operation in which the memory cell transistor MT retains data of 2 bits or more. In other words, the data latch circuit ADL is used for retaining the lower page. The data latch circuit BDL is used for retaining the middle page. The data latch circuit CDL is used for retaining the upper page. The number of data latch circuits included in the sense amplifier unit SAU is determined according to the number of bits retained by one memory cell transistor MT.

During the read operation, the sense amplifier SA detects the data read to the corresponding bit line BL and determines whether the data is data of 0 or data of 1. During the write operation, the sense amplifier SA applies a voltage to the bit line BL based on the write data.

The data register 29 includes a number of data latch circuits XDL corresponding to the sense amplifier units SAU0 to SAU(m−1). The data latch circuits XDL are connected to the input/output circuit 21. The data latch circuits XDL temporarily retain the write data sent from the input/output circuit 21, and temporarily retain the read data sent from the sense amplifier units SAU. More specifically, the data transfer between the input/output circuit 21 and the sense amplifier units 28 is performed via the data latch circuits XDL corresponding to one page. The write data received by the input/output circuit 21 is transferred to any one of the data latch circuits ADL, BDL, and CDL via the data latch circuit XDL. The read data read by the sense amplifier SA is transferred to the input/output circuit 21 via the data latch circuit XDL.

(Operation)

An operation of the memory system 1 configured as described above will be described below. In the memory system 1, each operation of writing data, reading data, or erasing data is performed in response to an instruction from the host device 4.

The write operation includes a program operation and a verify operation. In the write operation, a program loop including the program operation and the verify operation is repeated several times.

The program operation is an operation of increasing a threshold voltage of the memory cell transistor MT by applying a program voltage VPGM to a select word line WL, applying a predetermined voltage VPASS lower than the program voltage VPGM to a plurality of non-select word lines WL other than the select word line WL, and injecting charges (electrons) into a charge storage layer of the memory cell transistor MT, or an operation of maintaining the threshold voltage of the memory cell transistor MT by inhibiting the injection of electrons into the charge storage layer. The operation of increasing the threshold voltage is referred to as "writing of 0", and the operation of maintaining the threshold voltage is referred to as "writing of 1" or "write prevention". More specifically, during the writing of "0" and the writing of "1", different voltages are applied to the bit line BL. For example, a ground voltage VSS is applied to the bit line BL corresponding to the writing of "0". For example, a power supply voltage VDD (>VSS) is applied to the bit line BL corresponding to the writing of "1".

The verify operation is an operation of reading data in the memory cell transistor MT after the program operation and determining whether the threshold voltage of the memory cell transistor MT reaches a target level. A case where the threshold voltage of the memory cell transistor MT reaches the target level will be referred to as "passed verification", and a case where the threshold voltage does not reach the target level will be referred to as "failed verification".

In the read operation, read voltages VA and VB are applied to the select word line WL, and a predetermined voltage VPASS is applied to a plurality of non-select word lines WL other than the select word line WL, so that threshold voltages of the memory cell transistors MT corresponding to the select word lines WL are determined, respectively.

After the predetermined voltage is applied to the word line WL in the write operation and the read operation, the word line WL and select gate lines SGD and SGS are once set to the ground voltage VSS.

A WL (word line) creep-up will be described below.

In the memory cell array 20 having the three dimensional structure, channel regions of the memory cell transistor MT are not directly connected to the substrate (that is, the p-type well region 30) but are connected to the bit line BL and the substrate via the select transistors ST1 and ST2, respectively. For this reason, when the select transistors ST1 and ST2 are cut off, charges of the channel regions cannot easily move to the bit line BL and the substrate, and slowly escape as a leak current of the select transistors ST1 and ST2.

Figure 7:
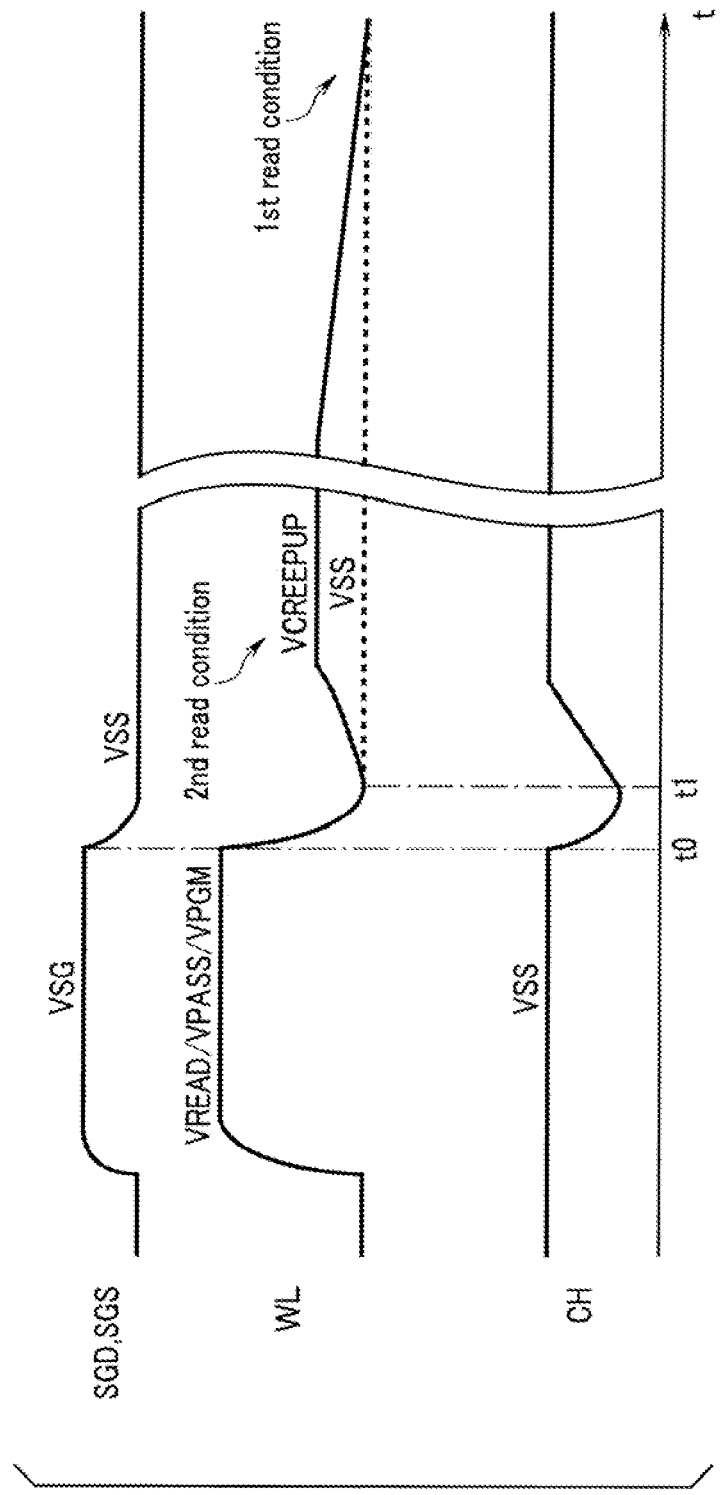
FIG. 7 is a view illustrating a word line creep-up according to the first embodiment.

In the present embodiment, a phenomenon in which the voltage of the word line WL rises due to capacitive coupling between the channel region (or the channel region of the NAND string NS) of the memory cell transistor MT and the word line WL is called the WL creep-up. FIG. 7 is a view illustrating the word line (WL) creep-up.

For example, assuming that the channel region CH is at the ground voltage VSS (0 V), the word line WL is at the voltage VREAD, and the select gate lines SGD and SGS are at the voltage VSG at a certain time during the read operation of the data. At time t0, the read operation is completed, and the word line WL and the select gate lines SGD and SGS drop to the ground voltage VSS.

At this time, a potential of the channel region CH lowers to a negative value due to the capacitive coupling between word line WL and the channel region CH of the NAND string NS (time t1). Then, the charges of the channel region CH gradually escape to the substrate and/or the bit line BL due to the leak current, and the potential of the channel region CH returns to the ground voltage VSS. When the potential of the channel region CH returns to the ground voltage VSS, the word line WL capacitively coupled to the channel region CH rises to a creep-up voltage VCREEPUP (for example, 4 V). Thereafter, the voltage of the creep-up word line WL gradually lowers due to the leak current of the transistor for driving the word line WL.

A condition of the memory cell transistor MT when the creep-up of the word line WL does not occur is called a 1st read condition (or a 1st access condition), and a condition of the memory cell transistor MT when the creep-up of the word line WL occurs is called a 2nd read condition (a 2nd access condition).

Such a WL creep-up also similarly occurs during the data write operation. Normally, since the verify operation is performed in the 2nd read condition in which the word line WL is creeping up, the 2nd read condition desirably continues for a long time. However, as a time passes thereafter, the word line WL gradually changes from the 2nd read condition to the 1st read condition. When the potential of the word line WL lowers from the creep-up voltage VCREEPUP and a difference from the ground voltage VSS disappears, the threshold voltage of each of the memory cell transistors MT of the word lines WL fluctuates. In other words, an error occurs in reading although the verify operation has passed in writing.

The memory cell transistor MT subjected to the program operation is in the 2nd read condition immediately after the program operation (for example, time shorter than 100 μs to 10 ms from the completion of the program), transitions to the 1st read condition after 100 μs to 10 ms, for example, and is in the 1st read condition even after several minutes to several tens of minutes, for example.

In other words, the memory cell transistor MT in the 1st read condition and the memory cell transistor MT in the 2nd read condition have different threshold distributions even for the same memory cell transistor MT. In other words, the result of the reading for the memory cell transistor MT in the 1st read condition may be different from the result of the reading for the memory cell transistor MT in the 2nd read condition. According to experiment, when the word line WL transitions from the 1st read condition to the 2nd read condition, a lower level of the threshold distributions of the memory cell transistors MT is up-shifted, and an upper level of the threshold distributions of the memory cell transistors MT is down-shifted. The shift of the threshold distributions leads to an increase in the number of bits in which the written level is determined as fail in the read operation.

Accordingly, the memory cell transistor MT is not desirable to transition to the 1st read condition immediately after the program operation, and is desirable to maintain the 2nd read condition for a long time immediately after the program operation.

However, in order to completely or fully discharge the charges in each of the word lines WL and each of the channel regions CH after the data write operation, the select transistors ST1 and ST2 may be turned off, that is, the voltage applied to the select gate lines SGD and SGS may be set to VSS and the potential of each of the word lines WL may be lowered to the ground voltage VSS. Specifically, a clock signal is generated in order to execute a recovery operation for completely or fully discharging the charges in each of the word lines WL and each of the channel regions CH. When such a recovery operation is executed, the memory cell transistor MT of each of the write word lines WL immediately transitions to the 1st read condition.

Therefore, it can be considered to adopt a method of performing a dummy read operation after the recovery operation such that each of the memory cell transistor MT transitions to the 2nd read condition. However, when the recovery operation and the dummy read operation are executed, the period of time of the data write operation becomes longer as a whole, which is contrary to the demand for high-speed data writing to the semiconductor memory device.

In the present embodiment, therefore, after the data program operation, the word line WL is not dropped to the ground potential VSS, and is maintained at a predetermined voltage higher than the ground potential VSS. In other words, the row decoder 26 supplies a predetermined voltage Vs higher than the ground voltage VSS to each of the plurality of word lines WL immediately after the completion of the write operation of the G-level data to the selected word line WL, for example.

Figure 8:
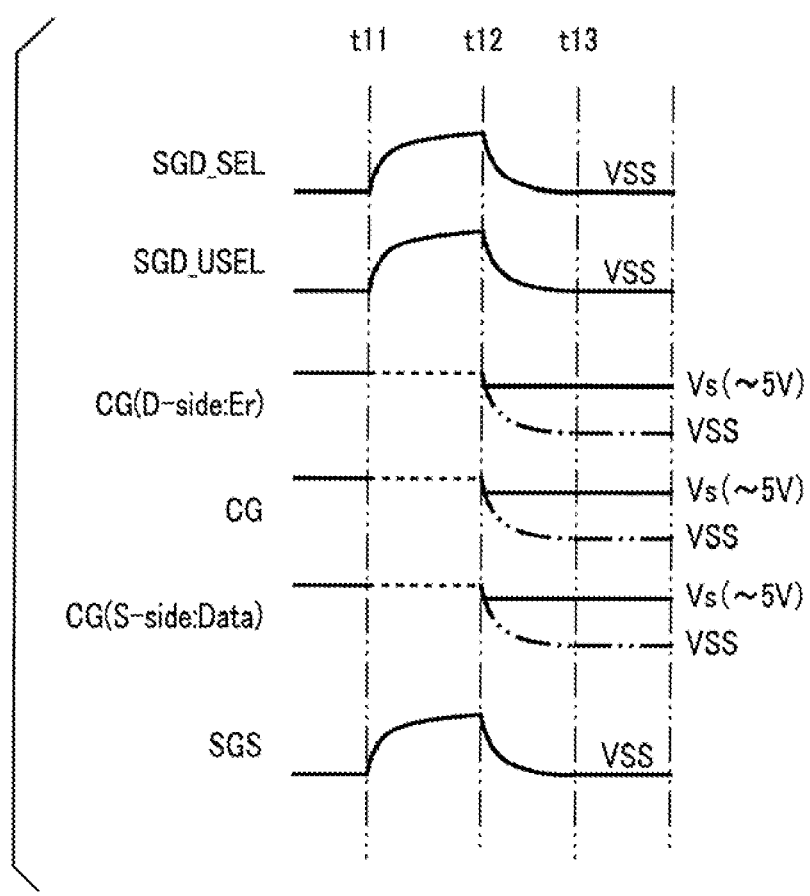
FIG. 8 is a waveform diagram illustrating changes in respective signals when a program operation is performed on any one of select word lines according to the first embodiment.

FIG. 8 is a waveform diagram illustrating changes in respective signals when the program operation is performed on any one of the select word lines WL in the present embodiment. In the present embodiment, after the program operation, the select transistor, the non-select transistor ST1, and the select transistor ST2 are turned off, that is, the voltage related to the select gate lines SGD and SGS is set to VSS and the voltage of the word line WL is maintained at a predetermined voltage (for example, 5 V) without being set to the ground voltage VSS for the recovery operation. The predetermined voltage (for example, 5 V) is generated and output by the row decoder 26. The predetermined voltage is set in the control circuit 24 in advance, and can be changed in setting.

FIG. 8 illustrates changes in voltages of a select gate line SGD_SEL of a select transistor ST1 of a selected string unit SU, a select gate line SGD_USEL of a select transistor ST1 of a non-selected string unit SU, a CG line 25A of a selected word line WL, a CG line 25A (D-side: Er) of a unwritten word line WL of a non-selected word line WL, a CG line 25A (S-side: Data) of a written word line WL of a non-selected word line WL, and a select gate line SGS of a select transistor ST2. Here, a case is shown in which data is sequentially written to the word lines WL0 to WL7.

In FIG. 8, a predetermined high voltage is applied to the select gate lines SGD and SGS for a program operation at time t11, so that the select transistors ST1 and ST2 are turned on and a predetermined program operation is executed for the selected word line WL.

As described above, when the select transistors ST1 and ST2 are turned off and the voltage of each of the CG lines 25A is set to the ground voltage VSS after time t12, each of the memory cell transistors MT immediately changes to the 1st read condition.

However, in the present embodiment, when the execution of the program operation is completed at time t12, the select transistors ST1 and ST2 are turned off, that is, the voltage related to the select gate lines SGD and SGS is set to the ground voltage VSS and the voltage of the word line WL is maintained at a predetermined voltage (for example, 5 V) without being set to the ground voltage VSS. In other words, the row decoder 26 supplies, based on a control signal from the control circuit 24, a predetermined voltage Vs higher than the ground voltage VSS to each of the plurality of word lines WL after the program operation for writing data to the selected word line WL is completed. In the case of FIG. 8, after the program operation is completed, the row decoder 26 turns on the select transistors ST1 and ST2 at time t11, transitions the select transistors to a cut-off state at time t12, and supplies a predetermined voltage Vs to each of the plurality of word lines WL after the time t12.

As a result, after the writing of the data, the voltage of each of the CG lines 25A is not lowered to VSS as indicated by a chain double-dashed line, but is set to a predetermined voltage Vs as indicated by a solid line, so that the 2nd read condition of the word line WL can be maintained for a long time. Then, the voltage supply from the row decoder 26 to the selected word line WL and the non-selected word line WL is stopped. When the program operation for one word line WL is completed, the program operation or the read operation for the other word line WL is executed. After the read operation is completed, the word line WL may not be set to the ground voltage, and the completion operation of applying a predetermined voltage to the word line WL may not be performed. In this case, since the voltage remains on the word line WL, the creep-up hardly occurs. In other words, the operation after the completion of the read operation is different from the operation after the completion of the program operation. The voltage applied to the selected/non-selected word line WL in the read operation is lower than the voltage applied to the selected word line WL in the program operation. Therefore, the circuit operation is not affected even when the voltage remaining on the word line WL after the read operation is set to the ground voltage VSS and is not discharged.

In FIG. 8, all of the CG line 25A of the select word line WL, the CG line 25A (D-side: Er) of the unwritten word line WL of the non-select word line WL, and the CG line 25A (S-side: Data) of the written word line WL of the non-select word line WL are set to the same predetermined voltage Vs. However, as a modification of the present embodiment, the CG line 25A (D-side: Er) of the unwritten word line WL of the non-select word line WL may be set to a predetermined voltage Vsc lower than the predetermined voltage Vs.

Figure 9:
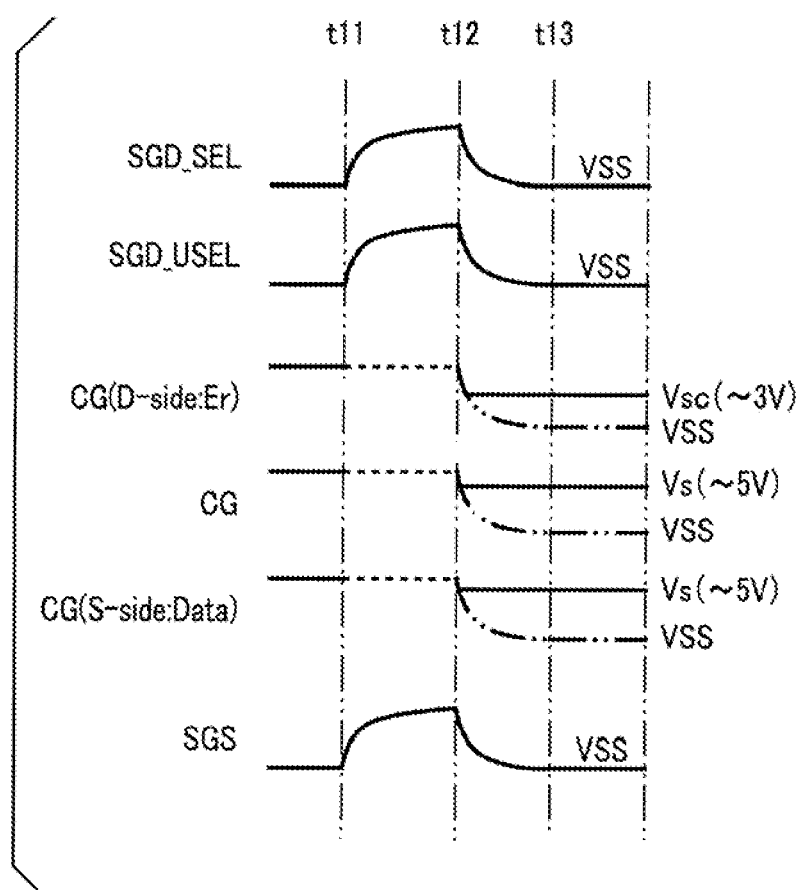
FIG. 9 is a waveform diagram illustrating changes in respective signals when a voltage of a control gate, which is a part of a plurality of word lines, is made different from a voltage of a control gate of the other word lines according to a modification of the first embodiment.

FIG. 9 is a waveform diagram illustrating changes in respective signals when the voltage of the CG line 25A, which is a part of the plurality of word lines WL, is made different from a voltage of a control gate CG of the other word lines WL.

In FIG. 9, a voltage of a CG line 25A (D-side: Er) of an unwritten word line WL of a non-select word line WL is set to a voltage Vsc (for example, 3 V) lower than the predetermined voltage Vs after time t12. In other words, according to this modification, the predetermined voltage Vs supplied from the row decoder 26 is different in a part of the plurality of word lines WL. Specifically, the predetermined voltage Vsc supplied to the word line WL not subjected to the data program operation is lower than the predetermined voltage Vs supplied to the word line WL subjected to the data program operation.

Since the memory cell transistor MT on the side where the data program operation is not completed has the lowest threshold voltage level Er, the potential of the channel is likely to rise. Therefore, when the potential difference of the channel between the CC line 25A of the select word line WL and the drain-side CG line 25A becomes large, hot carrier injection may occur. Accordingly, as described above, the voltage of the CG line 25A (D-side: Er) of the unwritten word line WL of the non-select word line WL is set to the voltage Vsc lower than the predetermined voltage Vs after the time t12 to prevent the occurrence of hot carrier injection.

According to the embodiment described above, it is possible to provide a semiconductor memory device capable of writing the data at high speed.

Second Embodiment

The select transistors ST1 and ST2 are once turned on and then turned off after the program operation in the first embodiment, but the select transistors ST1 and ST2 are not turned on and are kept in an OFF state after the program operation in the second embodiment.

Since components of the present embodiment are substantially the same as the components of the semiconductor device of the first embodiment, the same components are denoted by the same reference numerals and will not be described, and other components and operations will be described.

Figure 10:
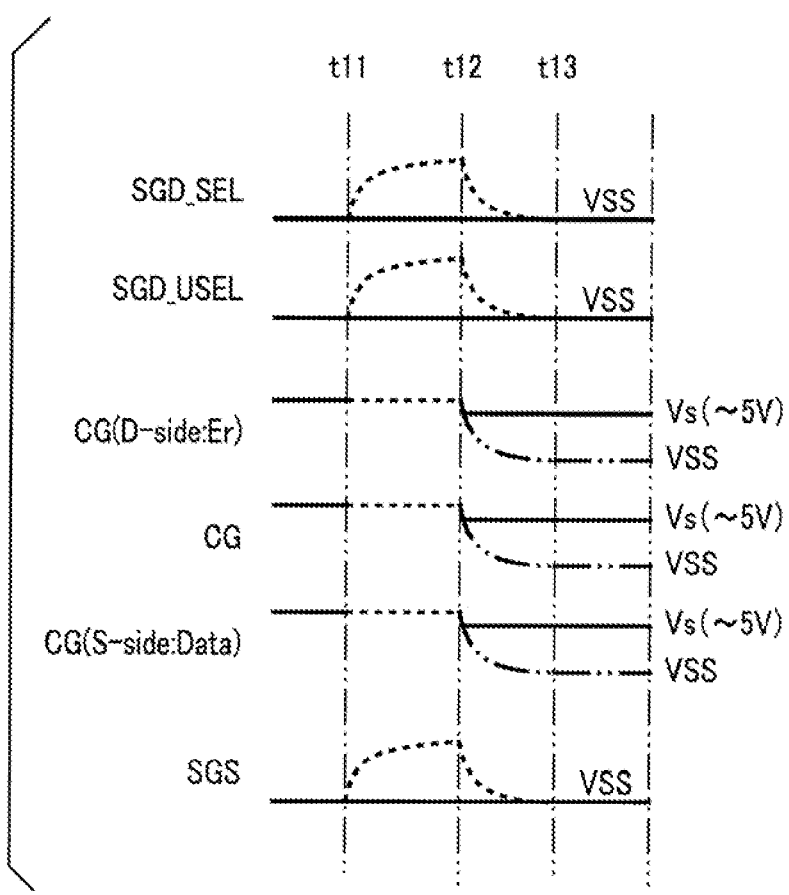
FIG. 10 is a waveform diagram illustrating changes in respective signals when a program operation is performed on any one of select word lines according to a modification of a second embodiment.

FIG. 10 is a waveform diagram illustrating changes in respective signals when the program operation is performed on any one of the select word lines WL in the present embodiment. In the present embodiment, after the program operation for the select word line WL, the select transistor, the non-select transistor ST1, and the select transistor ST2 are kept in the OFF state, that is, a voltage related to the select gate lines SGD and SGS is set to the ground voltage VSS and a voltage of the word line WL is maintained at a predetermined voltage (for example, 5 V) without being set to a voltage (ground voltage VSS) for a recovery operation. The predetermined voltage Vs (for example, 5 V) is generated and output by the row decoder 26. In the case of the present embodiment, the row decoder 26 supplies a predetermined voltage Vs to each of the plurality of word lines WL in a state where the select transistors ST1 and ST2 are in a cut-off state after the program operation is completed.

In the present embodiment, since the voltages of the select gate lines SGD and SGS are kept at the ground voltage VSS and the charges during the program operation are left in the channel regions CH, the creep-up voltage is less likely to decrease in the memory cell transistor MT subjected to the program operation.

Accordingly, in the present embodiment, since the select gate lines SGD and SGS are not turned on after the program operation, the memory cell transistor MT is easily maintained in the 2nd read condition.

The modification of the first embodiment described above can also be applied to the present embodiment.

According to the embodiment described above, it is possible to provide a semiconductor memory device capable of writing data at high speed.

In particular, it is possible to prove a semiconductor memory device capable of maintaining the 2nd read condition for a long time and writing data at high speed after the program operation.

There is a case where an instruction of the read operation is executed in the middle of the write operation and the write operation is temporarily stopped (suspended). The respective embodiments described above can be applied even during shifting to the suspend state. For example, when a suspend occurs during the write operation, the row decoder 26 supplies a predetermined voltage Vs (for example, 5 V) to the CG line 25A based on an instruction from the control circuit 24, and then temporarily stops the write operation. Then, the instruction of the read operation is executed.

The write operation is restarted (resumed) after the read operation is executed. However, since each of the memory cell transistors MT transitions to the 2nd read condition, the write operation is appropriately restarted.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A method of controlling a semiconductor memory device,
   the semiconductor memory device comprising:
   a first memory string including a plurality of first memory cell transistors connected to each other in series;
   a plurality of word lines connected to the plurality of first memory cell transistors, respectively;
   a first select transistor connected to one end of the first memory string;
   a first gate line connected to the first select transistor;
   a second select transistor connected to another end of the first memory string;
   a second gate line connected to the second select transistor;
   a bit line connected to the first select transistor;
   a source line connected to the second select transistor; and
   a control circuit configured to execute a plurality of write operations for writing data to the plurality of first memory cell transistors and a program operation including a plurality of verify operations, wherein
   when,
   among the plurality of first memory cell transistors, a memory cell transistor that is a target to write data is a first write target transistor,
   among the plurality of word lines, a word line to be connected to the first write target transistor is a select word line, and
   among the plurality of word lines, word lines other than the select word line are non-select word lines, and
   at completion of the program operation to write data to the first write target transistor:
   the controlling circuit is configured to:
   apply a voltage to turn on the first select transistor to the first gate line,
   apply a voltage to turn on the second select transistor to the second gate line, and
   apply a predetermined first voltage higher than a ground voltage to the select word line and the non-select word lines; and
   subsequent to the completion of the program operation:
   apply a voltage to turn off the first select transistor to the first gate line,
   apply a voltage to turn off the second select transistor to the second gate line, and
   apply a predetermined second voltage higher than the ground voltage to the select word line and the non-select word lines, wherein the voltage applied to the select word line and the non-select word lines is equal to or greater than the second voltage from a time of the completion of the program operation to a time subsequent to the completion of the program operation.

2. The method of controlling the semiconductor memory device according to claim 1, the semiconductor memory device further comprising:
   a second memory string including a plurality of fourth memory cell transistors connected to each other in series, the plurality of word lines being connected to the plurality of fourth memory cell transistors, respectively;
   a third select transistor connected to one end of the second memory string;
   a third gate line connected to the third select transistor;
   a fourth select transistor connected to another end of the second memory string;
   and
   a fourth gate line connected to the fourth select transistor,
   wherein the source line is connected to the fourth select transistor, and the bit line is connected to the third select transistor.

3. The method of controlling the semiconductor memory device according to claim 2, wherein the control circuit is configured to:
   in the plurality of write operations, when applying the voltage to turn on the first select transistor to the first gate line, apply a voltage to turn off the third select transistor to the third gate line.

4. The method of controlling the semiconductor memory device according to claim 3, wherein the control circuit is configured to:
   in the plurality of verify operations, when applying the voltage to turn on the first select transistor to the first gate line, apply a voltage to turn off the third select transistor to the third gate line.

5. The method of controlling the semiconductor memory device according to claim 2, wherein the control circuit is configured to:
   at the completion of the program operation, when applying the voltage to turn on the first select transistor to the first gate line, apply a voltage to turn on the third select transistor to the third gate line.

6. The method of controlling the semiconductor memory device according to claim 5, wherein the controlling circuit is configured to:
   subsequent to the completion of the program operation, when applying the voltage to turn off the first select transistor to the first gate line, and applying the voltage to turn off the second select transistor to the second gate line, apply a voltage to turn off the third select transistor to the third gate line.

7. The method of controlling the semiconductor memory device according to claim 1, wherein the completion of the program operation is a time of the completion of the program operation to write data with a highest threshold voltage to the first write target transistor.

8. A method of controlling a semiconductor memory device,
the semiconductor memory device comprising:
a first memory string including a plurality of first memory cell transistors connected to each other in series;
a plurality of word lines connected to the plurality of first memory cell transistors, respectively;
a first select transistor connected to one end of the first memory string;
a first gate line connected to the first select transistor;
a second select transistor connected to another end of the first memory string;
a second gate line connected to the second select transistor;
a bit line connected to the first select transistor;
a source line connected to the second select transistor; and
a control circuit configured to execute a plurality of write operations for writing data to the plurality of first memory cell transistors and a program operation including a plurality of verify operations, wherein
when,
among the plurality of first memory cell transistors, a memory cell transistor that is a target to write data is a first write target transistor,
among the plurality of word lines, a word line to be connected to the first write target transistor is a select word line,
among the plurality of word lines, word lines on a side of the bit line with respect to the select word line are first non-select word lines, and
among the plurality of word lines, word lines on a side of the source line with respect to the select word line are second non-select word lines,
at completion of the program operation to write data to the first write target transistor:
the controlling circuit is configured to:
apply a voltage to turn on the first select transistor to the first gate line,
apply a voltage to turn on the second select transistor to the second gate line, and
apply a predetermined first voltage higher than a ground voltage to the select word line and the first non-select word lines and a second voltage higher than the ground voltage but lower than the first voltage to the second non-select word lines; and
subsequent to the completion of the program operation:
apply a voltage to turn off the first select transistor to the first gate line,
apply a voltage to turn off the second select transistor to the second gate line, and
apply a predetermined third voltage higher than the ground voltage to the select word line and the first non-select word lines, wherein a fourth voltage higher than the ground voltage but lower than the third voltage is applied to the second non-select word lines.

9. The method of controlling the semiconductor memory device according to claim 8, wherein the completion of the program operation is a time of the completion of the program operation to write data with a highest threshold voltage to the first write target transistor.

* * * * *